(12) United States Patent
Sato

(10) Patent No.: US 9,490,748 B2
(45) Date of Patent: Nov. 8, 2016

(54) RECEIVING DEVICE

(71) Applicant: FUJITSU LIMITED, Kawasaki-shi, Kanagawa (JP)

(72) Inventor: Masaru Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 17 days.

(21) Appl. No.: 14/164,390

(22) Filed: Jan. 27, 2014

(65) Prior Publication Data

US 2014/0247083 A1  Sep. 4, 2014

(30) Foreign Application Priority Data

Mar. 1, 2013 (JP) ................. 2013-040621

(51) Int. Cl.
*G06G 7/12* (2006.01)
*H03D 1/10* (2006.01)
*H03D 7/02* (2006.01)
*H03D 7/16* (2006.01)
*H03G 3/30* (2006.01)

(52) U.S. Cl.
CPC .................. *H03D 1/10* (2013.01); *H03D 7/02* (2013.01); *H03D 7/165* (2013.01); *H03G 3/3052* (2013.01)

(58) Field of Classification Search
CPC ... H02J 2001/004; H02J 7/34; H02M 3/1588
See application file for complete search history.

(56) References Cited

U.S. PATENT DOCUMENTS

| 4,769,735 A | * | 9/1988 | Ueda ................... H02H 1/0038 361/87 |
| 5,386,149 A | * | 1/1995 | Arima .................. G06N 3/0635 365/222 |
| 7,619,468 B1 | | 11/2009 | Bowles et al. |
| 2006/0220683 A1 | * | 10/2006 | Chun ................... H03K 17/164 326/82 |
| 2007/0046600 A1 | * | 3/2007 | Sun ....................... G09G 3/3688 345/89 |
| 2008/0191889 A1 | | 8/2008 | Nakamoto |
| 2009/0195304 A1 | * | 8/2009 | Bankman ........... H03H 11/0422 327/552 |

FOREIGN PATENT DOCUMENTS

| EP | 0 115 385 A2 | 8/1984 |
| EP | 0 115 385 A3 | 8/1984 |
| JP | 2007235804 A | 9/2007 |
| JP | 2008196897 A | 8/2008 |
| WO | 2011161858 A1 | 12/2011 |

OTHER PUBLICATIONS

Extended European Search Report dated Mar. 27, 2014, in the corresponding European patent application No. 14152448.8.
Office Action of corresponding Japanese Patent Application No. 2013-040621 dated Jun. 28, 2016, with partial translation.

* cited by examiner

*Primary Examiner* — Sibin Chen
(74) *Attorney, Agent, or Firm* — Kratz, Quintos & Hanson, LLP

(57) ABSTRACT

A receiving device includes a dividing circuit, N pieces of internal circuits, and an averaging circuit. The dividing circuit is configured to divide an input signal into N pieces of divided signals (where N is an integer of two or larger), and the N pieces of internal circuits are configured to receive and process the N pieces of divided signals. The averaging circuit is configured to receive N pieces of output signals from the N pieces of internal circuits, averaging the output signals, and output an averaged signal.

12 Claims, 9 Drawing Sheets

RECEIVING DEVICE

CROSS-REFERENCE TO RELATED APPLICATION

This application is based upon and claims the benefit of priority of the prior Japanese Patent Application No. 2013-040621, filed on Mar. 1, 2013, the entire contents of which are incorporated herein by reference.

FIELD

The embodiments discussed herein are related to a receiving device.

BACKGROUND

In recent years, wireless communication technologies are applied in various fields. For example, in a demodulator of a communication device such as a cellular phone, a wireless LAN (Local Area Network), a radar, a spectrum analyzer, or the like, a receiving device which detects an input signal is used.

For example, in a circuit (receiving device) which demodulates a signal subjected to signal amplitude modulation (AM: Amplitude Modulation), a signal received by an antenna is demodulated by an internal circuit (detector), and the demodulated signal is processed by a voltmeter, an AD (Analog-to-Digital) converter, a digital circuit, or the like. In the receiving device, for example, a range of a proper input signal intensity (input power) for operating the detector is called a dynamic range of the detector.

For example, when the input power is smaller than the lower limit of the usable range of the detector, although the output voltage (detected voltage) of the detector is output, the voltage is too low. Therefore, for example, it is difficult to detect the voltage by a voltmeter at the subsequent stage. When input power is small, for example, an amplifier is provided at the preceding stage of the detector so that the input power becomes larger than the lower limit of the usable range of the detector.

On the other hand, when the input power is larger than the upper limit of the usable range of the detector, an output of the detector is saturated and, for example, it becomes difficult to detect a detected voltage according to the input power by a voltmeter at the subsequent stage. Consequently, when the input power is large, for example, an attenuator (resistor) is provided at the preceding stage of the detector so that the input power becomes smaller than the upper limit of the usable range of the detector.

As described above, the upper and lower limits of the usable range (dynamic range) exist for the input power of the detector. When the input power of the detector lies out of the dynamic range, for example, an amplifier or a resistor is provided at the preceding stage of the detector so that a process of making the input power lie in the dynamic range is performed. In some cases, an amplifier or a resistor may be provided at the subsequent stage of the detector.

However, even when an amplifier or a resistor is provided at the preceding stage (subsequent stage) of the detector, the dynamic range itself is difficult to be enlarged. This is an issue not only for the detector but also for, for example, another internal circuit (receiving device) such as a mixer.

Conventionally, various receiving devices with a characteristic improved by processing an input signal of a detector are being proposed.

Patent Document 1: Japanese Laid-open Patent Publication No. S59-133749
Patent Document 2: Japanese Laid-open Utility Model Publication No. S62-164410
Patent Document 3: Japanese Laid-open Patent Publication No. H02-078306

SUMMARY

According to an aspect of the embodiments, there is provided a receiving device including a dividing circuit, N pieces of internal circuits, and an averaging circuit.

The dividing circuit is configured to divide an input signal into N pieces of divided signals (where N is an integer of two or larger), and the N pieces of internal circuits are configured to receive and process the N pieces of divided signals. The averaging circuit is configured to receive N pieces of output signals from the N pieces of internal circuits, averaging the output signals, and output an averaged signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
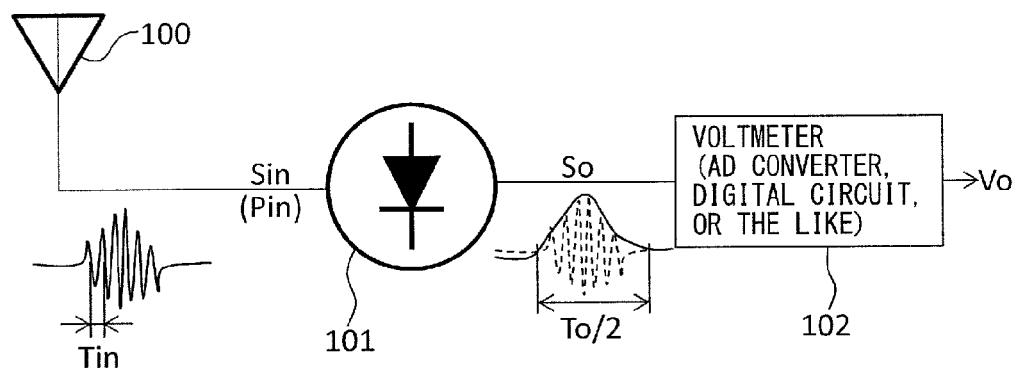
FIG. 1 is a block diagram illustrating an example of a receiving device.

Before describing embodiments of a receiving device, examples of a receiving device and their problems will be described with reference to FIG. 1 to FIGS. 4A and 4B. FIG. 1 is a block diagram illustrating an example of a receiving device and illustrates a receiving device to be applied to, for example, a communication device, a radar, a spectrum analyzer, or the like, for example as an AM demodulator using a diode detector.

In FIG. 1, reference numeral 100 denotes an antenna, 101 denotes a diode detector (envelope detector, detector), and 102 denotes a voltmeter (or AD (Analog-to-Digital) converter, digital circuit, or the like).

As illustrated in FIG. 1, a receiving device (AM demodulator) includes the detector 101 for receiving a reception signal (input signal) Sin from the antenna 100 and detects an envelope, and the voltmeter 102. The voltmeter 102 receives a demodulation signal (output signal) So from the detector 101, detects a voltage Vo of the signal, and outputs the voltage Vo.

In FIG. 1, reference character Tin denotes one cycle of a carrier wave (carrier) of the input signal Sin, and To/2 denotes a half cycle of the output signal So of the detector 101. Therefore, one cycle of the output signal So corresponds to a cycle is about twice To/2 in FIG. 1.

Figure 2:
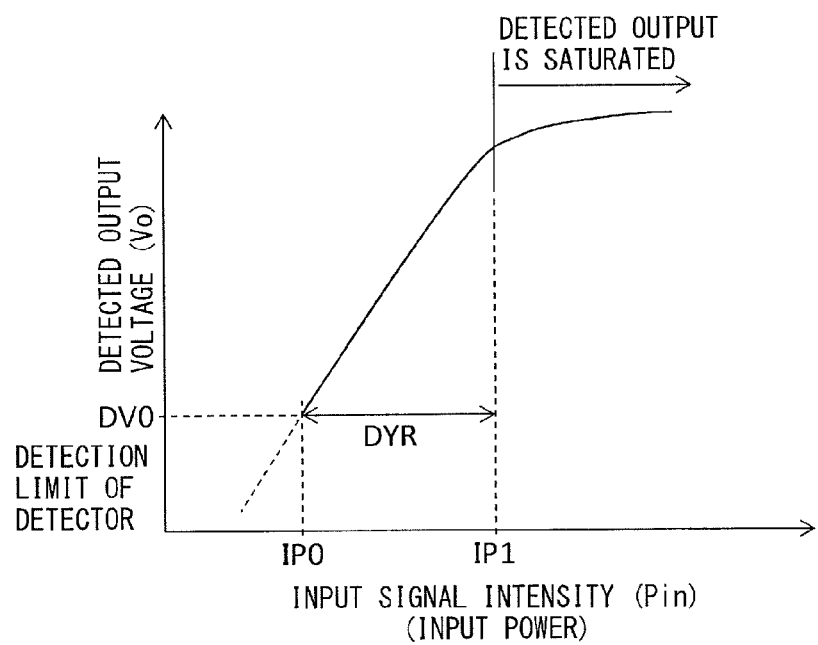
FIG. 2 is a diagram for explaining a dynamic range of a detector in the receiving device illustrated in FIG. 1.

FIG. 2 is a diagram for explaining a dynamic range of a detector in the receiving device illustrated in FIG. 1. In FIG. 2, the vertical axis denotes the voltage (output of the voltmeter 102, detected output voltage) Vo of the output signal So of the detector 101, and the horizontal axis denotes power (input signal intensity, input power) Pin of the input signal Sin of the detector 101.

As illustrated in FIG. 2, in a range where the input power Pin of the detector 101 is from IP0 to IP1, the detected output voltage Vo of the detector 101 increases as the input power Pin increases.

However, for example, when the input power Pin of the detector 101 is smaller than IP0, the detector 101 is difficult to detect the input signal Sin. Alternatively, for example, when the input power Pin is smaller than IP0, even when the detector 101 outputs an output signal, the voltmeter 102 at the subsequent stage is difficult to detect the voltage of the output signal, and the detected output voltage Vo becomes lower than voltage DV0 as the detection limit of the detector 101.

On the other hand, for example, when the input power Pin of the detector 101 is larger than IP1, the detector 101 is difficult to detect the input signal Sin and the output signal So of the detector 101 is saturated. Alternatively, when the input power Pin of the detector 101 is larger than IP1, even when the detector 101 outputs an output signal, the voltmeter 102 at the subsequent stage is saturated by the output voltage.

As described above, the detector 101 includes a predetermined range DYR specified by the upper and lower limits of the usable range in the input power (input signal) Pin, and the predetermined range DYR of the input power Pin is called a dynamic range.

Figure 3A:
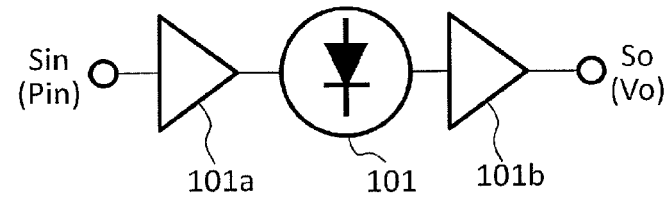
FIGS. 3A and 3B are diagrams for explaining a modification of the receiving device.
Figure 3B:
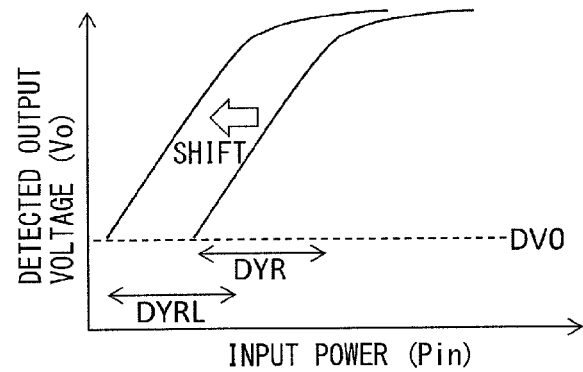

FIGS. 3A and 3B are diagrams for explaining a modification of the receiving device. FIG. 3A is a block diagram of the modification of the receiving device, and FIG. 3B is a diagram for explaining the characteristic of the receiving device of FIG. 3A.

As illustrated in FIG. 3A, in the modification of the receiving device, an amplifier 101a is provided at a preceding stage of the detector 101. Even when the input power Pin of the input signal Sin is small, the input power Pin is amplified to a power which may be detected by the detector 101, and the amplified power is supplied to the detector 101.

FIG. 3A also illustrates the case where, for example, an output signal of the detector 101 is difficult to be processed by an AD converter (102) at the subsequent stage and, in this case, an amplifier 101b is provided at the subsequent stage of the detector 101 (the preceding stage of the AD converter 102).

In other words, the amplifier 101b is provided at the subsequent stage of the detector 101 so that, for example, even when the input power Pin is small and the output signal of the detector 101 is small, the power is amplified to a level at which the AD converter 102 at the subsequent stage may accurately perform AD conversion. Note that when the amplifier 101b is provided at the subsequent stage of the detector 101, the detected output voltage Vo is the output of the amplifier 101b.

However, as illustrated in FIG. 3B, even when the amplifier is provided at the preceding stage or the subsequent stage of the detector 101, the dynamic range DYR simply shifts to DYRL on the low level side of the input signal (the left side in the diagram), and the dynamic range itself is difficult to be enlarged.

Figure 4A:
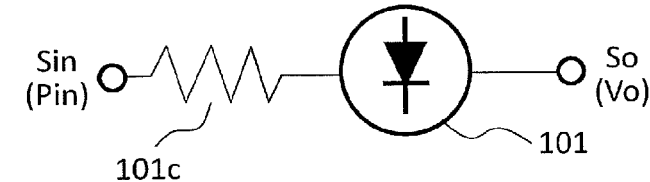
FIGS. 4A and 4B are diagrams for explaining another modification of the receiving device.
Figure 4B:
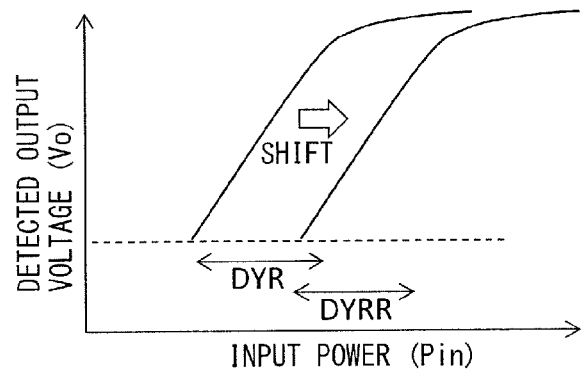

FIGS. 4A and 4B are diagrams for explaining a receiving device in another modification. FIG. 4A is a block diagram illustrating the receiving device in another modification, and FIG. 4B is a diagram for explaining the characteristic of the receiving device of FIG. 4A.

As illustrated in FIG. 4A, the receiving device in another modification is provided with an attenuator (resistor) 101c at the preceding stage of the detector 101. For example, when the input power Pin of the input signal Sin is large, the power is decreased to power which may be detected by the detector 101, and the resultant power is supplied to the detector 101.

Alternatively, the output signal So from the detector 101 is decreased to a level at which the AD converter 102 at the subsequent stage may accurately perform AD conversion without causing saturation. A resistor may be provided at the subsequent stage of the detector 101.

However, as illustrated in FIG. 4B, even when a resistor is provided at the preceding stage (subsequent stage) of the detector 101, the dynamic range DYR simply shifts to DYRR on the high level side of the input signal (the right side in the diagram), and the dynamic range itself is difficult to be enlarged.

Figure 5:
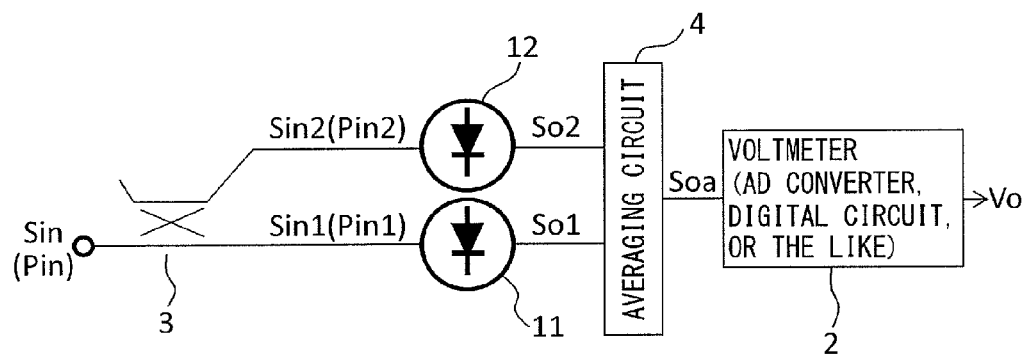
FIG. 5 is a block diagram illustrating a receiving device of a first embodiment.

Hereinbelow, a receiving device of the embodiments will be described in detail with reference to the accompanying drawings. FIG. 5 is a block diagram illustrating a receiving device of a first embodiment and illustrates a receiving device to be applied to, for example, a communication device, a radar, a spectrum analyzer, or the like, for example as an AM demodulator using a diode detector.

In FIG. 5, reference numerals 11 and 12 denote diode detectors (envelope detectors, detectors), reference numeral 2 denotes a voltmeter (or AD converter, digital circuit, or the like), 3 denotes a dividing circuit (power divider, coupler), and 4 denotes an averaging circuit.

As illustrated in FIG. 5, the receiving device (AM demodulator) includes the coupler 3 receiving the input signal Sin and dividing the signal into two divided signals Sin1 and Sin2, two detectors 11 and 12, the averaging circuit 4, and the voltmeter 2.

The coupler 3 receives the input signal Sin and divides the input signal into the two divided signals Sin1 and Sin2 having powers different from each other in accordance with a predetermined dividing ratio.

In other words, the coupler 3 does not equally divide the input signal Sin (1:1) but divides the input signal Sin into the two divided signals Sin1 and Sin2 so that the maximum value/minimum value, i.e., Pin1/Pin2 becomes 10, 100, 1,000, or the like.

Concretely, for example, when the coupler 3 having the dividing ratio of 10 dB is used, the input signal Sin of the input power Pin is divided to the two divided signals Sin1 and Sin2, and the ratio between the power Pin1 of the divided signal Sin1 and the power Pin2 of the divided signal Sin2 becomes 10:1.

For example, when the coupler 3 having the dividing ratio of 20 dB is used, the input signal Sin of the input power Pin is divided to the two divided signals Sin1 and Sin2, and the ratio between the power Pin1 of the divided signal Sin1 and the power Pin2 of the divided signal Sin2 becomes 100:1.

Further, for example, when the coupler 3 having the dividing ratio of 30 dB is used, the input signal Sin of the input power Pin is divided to the two divided signals Sin1 and Sin2, and the ratio between the power Pin1 of the divided signal Sin1 and the power Pin2 of the divided signal Sin2 becomes 1000:1.

As described above, the two divided signals Sin1 and Sin2 divided by the coupler 3 are supplied to the corresponding detectors 11 and 12, respectively. The detectors 11 and 12 have equivalent circuit configurations, equivalent characteristics, i.e., the same dynamic range.

When the dynamic range of the detectors 11 and 12 is 10 dB, the coupler 3 whose dividing ratio is 10 dB is applied. When the dynamic range of the detectors 11 and 12 is 20 dB, the coupler 3 whose dividing ratio is 20 dB is applied. Further, when the dynamic range of the detectors 11 and 12 is 30 dB, the coupler 3 whose dividing ratio is 30 dB is applied.

In other words, it is preferable to apply the coupler 3 having a dividing ratio which is equal to or nearly equal to the dynamic range of the detectors 11 and 12. As will be specifically described later, this is because that the dynamic range of the detector 11 and that of the detector 12 may be enlarged while reducing the overlap range.

The output signal So1 of the detector 11 and the output signal So2 of the detector 12 are supplied to the averaging circuit 4 and an averaging process is performed in the averaging circuit 4. An output signal of the averaging circuit 4 is supplied to the voltmeter 2 where voltage is detected. The voltmeter 2 may be an AD converter, a digital circuit, or the like.

Figure 6:
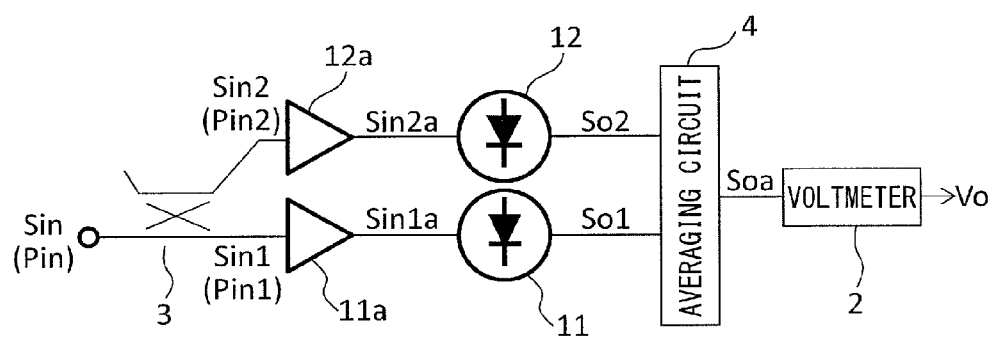
FIG. 6 is a block diagram illustrating a receiving device of a second embodiment.

FIG. 6 is a block diagram illustrating a receiving device of a second embodiment. As is clear from comparison between FIG. 6 and FIG. 5 described above, the receiving device of the second embodiment is constructed by providing an amplifier 11a between the coupler 3 and the detector 11 and providing an amplifier 12a between the coupler 3 and the detector 12. The amplification factors (gains) of the amplifiers 11a and 12a are equal to each other.

In other words, for example, in the receiving device of the first embodiment, the input signal Sin is divided to the two divided signals Sin1 and Sin2 by the coupler 3. Consequently, even when the power ratio between the divided signals Sin1 and Sin2 is 10:1, the power Pin1 of the divided signal Sin1 is decreased in comparison with the input power Pin.

Further, since the power Pin2 of the divided signal Sin2 is significantly decreased in comparison with the input power Pin, the amplifiers 11a and 12a are provided in order to make the general dynamic range proper.

In the receiving device of the second embodiment, the amplifiers 11a and 12a are provided in the preceding stage of the detectors 11 and 12, respectively.

Figure 7A:
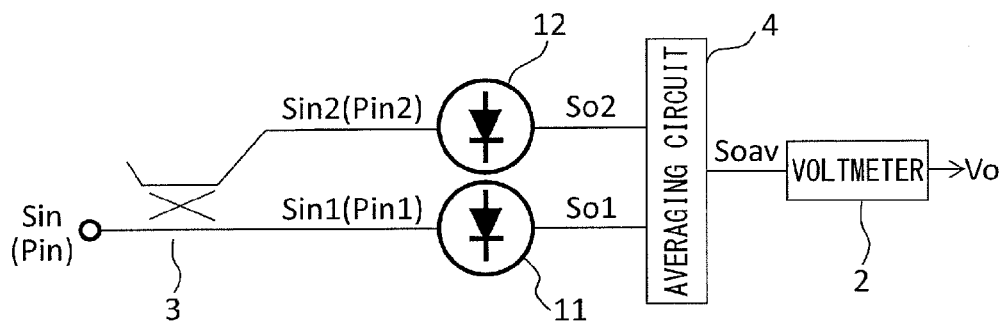
FIGS. 7A and 7B are diagrams for explaining operation of the receiving device of the first embodiment illustrated in FIG. 5.
Figure 7B:
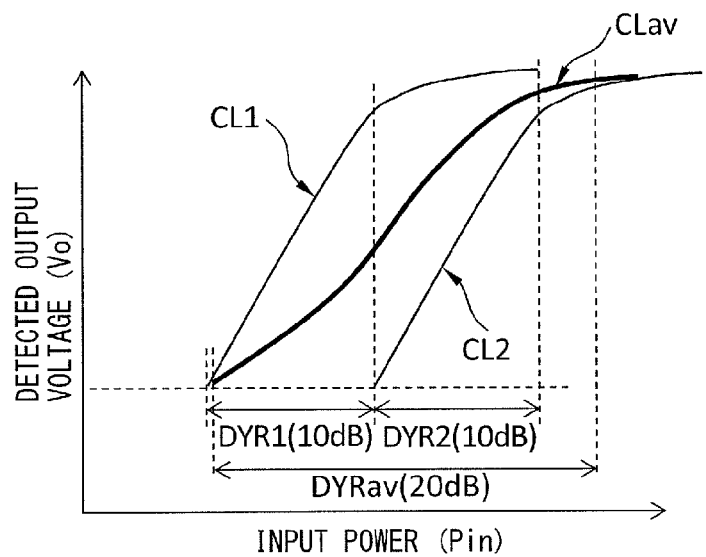

FIGS. 7A and 7B are diagrams for explaining operation of the receiving device of the first embodiment illustrated in FIG. 5. FIG. 7A corresponds to the above-described FIG. 5, and FIG. 7B is a diagram for explaining the dynamic range of a detector in the receiving device illustrated in FIG. 7A, i.e., the dynamic range of the input power Pin in the receiving device of the first embodiment.

It is now assumed that the detectors 11 and 12 have an equivalent circuit configuration and use, for example, the same dynamic range of 10 dB, i.e., the ratio of the upper and lower limits which may be used in the input powers Pint and Pin2 is 10:1.

Therefore, the coupler 3 whose dividing ratio of 10 dB is applied, and the power ratio of the input signals (the divided signals Sin1 and Sin2) of the detectors 11 and 12 divided by the coupler 3, i.e., Pin1:Pin2 is 10:1.

As illustrated in FIG. 7B, a dynamic range DYRav of an output Soav of the averaging circuit 4 is, for example, obtained by adding the dynamic range DYR1 of 10 dB of the detector 11 and the dynamic range DYR2 of 10 dB of the detector 12. The dynamic range DYR2 of the detector 12 corresponds to, for example, DYRR in FIG. 4B described above.

In other words, a curve CLav of the dynamic range DYRav of the receiving device is obtained by averaging a curve CL1 of DYR1 by the detector 11 and a curve CL2 of DYR2 by the detector 12 by the averaging circuit 4, so that the dynamic range DYRav is enlarged to 20 dB.

Specifically, when the dividing ratio of the coupler 3 is 10 dB, most of the input power Pin (Pin1: 90%) is supplied to the detector 11 and subjected to detecting process, and the output signal So1 is output. The curve CL1 (DYR1) of the output signal So1 is substantially same as that described with reference to FIG. 2. For example, when the input power Pin is smaller than IP0, the detector 11 is difficult to appropriately perform the detecting process. When Pin is larger than IP1, it is saturated.

A part (Pin2: 10%) of the input power Pin is supplied to the detector 12 and subjected to the detecting process, and the output signal So2 is output. The curve CL2 (DYR2) of the output signal So2 is, for example, substantially same as that described with reference to FIG. 4B. For example, even when the input power Pin is larger than IP1, the detector 12 may perform the detecting process.

Therefore, the dynamic range DYRav of the receiving device is obtained by seamlessly connecting the dynamic ranges DYR1 and DYR2 of the detectors 11 and 12 and may be enlarged twice as large as the dynamic range (10 dB) of the detectors 11 and 12.

For example, when the dynamic range of the detectors 11 and 12 is 20 dB, by applying the coupler 3 whose dividing ratio is 20 dB, the dynamic range DYRav of the receiving device may be enlarged to 40 dB.

When the dynamic range of the detectors 11 and 12 is 20 dB and the coupler 3 whose dividing ratio is 10 dB is applied, the dynamic ranges of the detectors 11 and 12 overlap only by 10 dB, so that the dynamic range DYRav of the receiving device becomes 30 dB.

However, when the dynamic range of the detectors 11 and 12 is 20 dB and the coupler 3 whose dividing ratio is 30 dB is applied, the dynamic ranges of the detectors 11 and 12 are discontinuous, so that it is not preferable.

As described above, in the receiving device of the embodiment, the dynamic range of the internal circuit may be enlarged. In the receiving device of the embodiment, although the dynamic range of the internal circuit (detector)

may be enlarged, for example, the sensitivity of the detector decreases more or less due to the averaging.

Consequently, it is preferable to apply the embodiment to a receiving device which is demanded to enlarge the dynamic range of the input power in spite of a certain amount of decrease of the sensitivity. Concretely, it is preferable to apply the embodiment to, for example, a receiving device using frequency exceeding GHz band, particularly, a receiving device using frequency (carrier frequency) higher than 10 GHz.

Figure 8:
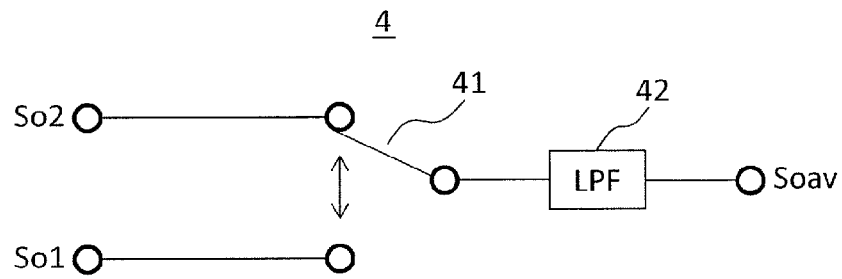
FIG. 8 is a block diagram illustrating an example of an averaging circuit.

FIG. 8 is a block diagram illustrating an example of the averaging circuit, and FIGS. 9A, 9B, 9C, and 9D are diagrams for explaining operation of a device obtained by applying the averaging circuit illustrated in FIG. 8 to the receiving device of the second embodiment illustrated in FIG. 6.

Figure 9A:
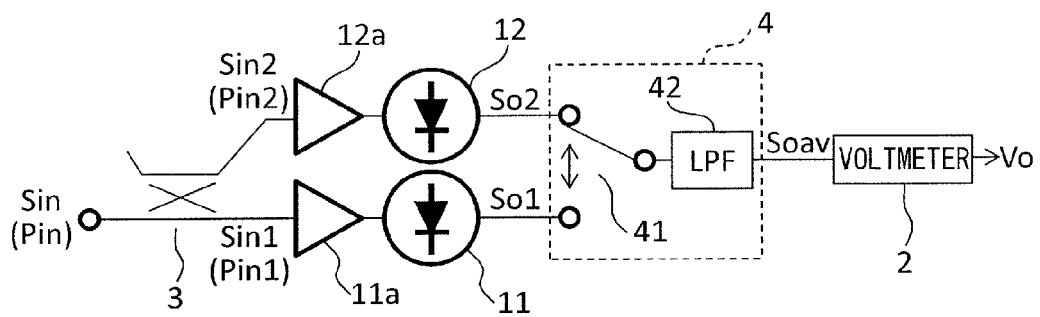
FIGS. 9A, 9B, 9C, and 9D are diagrams for explaining operation of a device obtained by applying the averaging circuit illustrated in FIG. 8 to the receiving device of the second embodiment illustrated in FIG. 6.
Figure 9B:
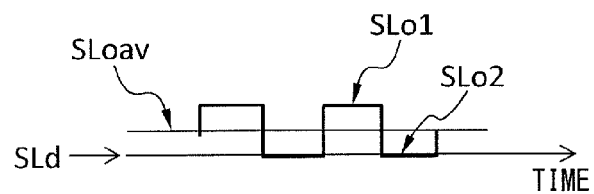

FIG. 9A is a block diagram of a device obtained by applying the averaging circuit 4 illustrated in FIG. 8 to the receiving device of the second embodiment, and FIG. 9B is a diagram illustrating output signals So1 and So2 of the detectors 11 and 12 and an output signal Soav of the averaging circuit 4 when a weak signal is received (when the input power Pin is weak).

Figure 9C:
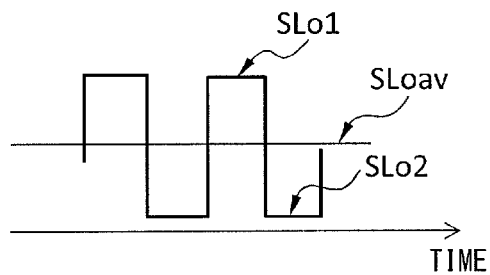
Figure 9D:
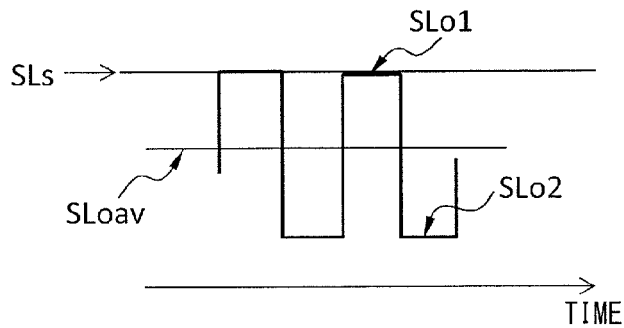

FIG. 9C is a diagram illustrating the output signals So1, So2, and Soav when the input power Pin is moderate, and FIG. 9D is a diagram illustrating the output signals So1, So2, and Soav when the input power Pin is large. Obviously, the operations illustrated in FIGS. 9B to 9D may be applied to the receiving device of the first embodiment shown in FIG. 5.

As illustrated in FIGS. 8 and 9A, the averaging circuit 4 includes a switch 41 switching between the output signals So1 and So2 of the detectors 11 and 12 at a predetermined timing and a low-pass filter 42 receiving the signal selected by the switch 41 and processing the signal.

The low-pass filter 42 receives the output signals So1 and So2 of the detectors 11 and 12 switched at the predetermined timing by the switch 41 and performs a process of filtering high-frequency components and passing low-frequency components.

The predetermined timing of switching the switch 41 is, for example, longer than one cycle (tin) of a carrier signal of the input signal Sin and shorter than the half of one cycle (To) of the output signals So1 and So2 of the detectors 11 and 12.

In other words, the frequency of a switching clock of the switch 41 is sufficiently higher than that of an input signal (for example, about ten times). The passing frequency of the low-pass filter 42 is set so that, for example, the frequency of the switching clock of the switch 41 may be cut off.

Referring now to FIGS. 9B to 9D, the relations among the magnitude of the input power Pin, the output signals So1 and So2 of the detectors 11 and 12, and the output signal Soav of the averaging circuit 4 will be described. In FIGS. 9B to 9D, reference character SLd denotes a detection limit level, and SLs denotes a saturation level.

Reference numeral SLo1 denotes a detection output level of the output signal So1 of the detector 11, which corresponds to a detection output level when the switch 41 in the averaging circuit 4 selects the output signal So1 of the detector 11.

Further, reference numeral SLo2 denotes a detection output level of the output signal So2 of the detector 12, which corresponds to a detection output level when the switch 41 in the averaging circuit 4 selects the output signal So2 of the detector 12. Reference character SLoav denotes a detection output level of the output signal Soav of the averaging circuit 4, i.e., a level obtained by averaging the detection output levels SLo1 and SLo2 of the detectors 11 and 12.

First, as illustrated in FIG. 9B, when the input signal Sin is weak, for example, a signal smaller than the dynamic range is supplied to the detector 12. Consequently, the detection output level SLo2 of the detector 12 becomes a very small level which is almost equal to the detection limit level SLd.

On the other hand, for example, a signal at an operable level is supplied to the detector 11. Consequently, the detection output level SLo1 of the detector 11 corresponds to the input power Pin. Therefore, the average value of output signals of the detectors 11 and 12, i.e., the detection output level SLoav of the averaging circuit 4 becomes a voltage value according to the input power Pin.

Next, as illustrated in FIG. 9C, when the input signal Sin is moderate, signals at operable levels are supplied to both of the detectors 11 and 12, and the detection output levels SLo1 and SLo2 of the detectors 11 and 12 become levels according to the input power Pin. Therefore, the detection output level SLoav of the averaging circuit 4 also become a voltage value according to the input power Pin.

Further, as illustrated in FIG. 9D, when the input signal Sin is large, for example, a signal larger than the dynamic range is supplied to the detector 11. Consequently, the detection output level SLo1 of the detector 11 becomes almost the saturation level SLs.

However, since the detector 12 is not saturated, the detection output level SLo2 of the detector 12 becomes a voltage value according to the input power Pin. Therefore, the detection output level SLoav of the averaging circuit 4 becomes a voltage value according to the input power Pin.

In such a manner, it is understood that, according to the receiving device of the embodiment, the dynamic range of the detectors 11 and 12 (internal circuits) may be enlarged.

Figure 10:
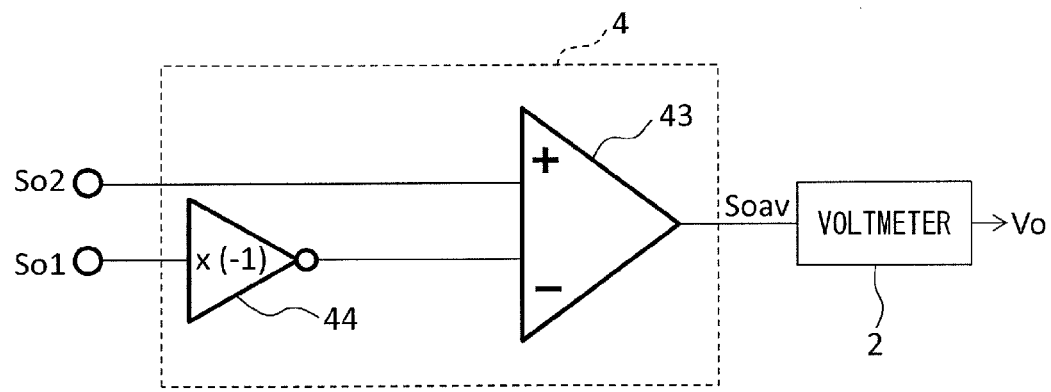
FIG. 10 is a block diagram illustrating another example of the averaging circuit.

FIG. 10 is a block diagram illustrating still another example of the averaging circuit. As illustrated in FIG. 10, the averaging circuit 4 includes a differential amplifier 43 and an inverter 44. The differential amplifier 43 receives a signal obtained by inverting the output signal So1 output from the detector 11 (first internal circuit) by the inverter 44 and the output signal So2 output from the detector 12 (second internal circuit) by differential input terminals (+ and −) and differential-amplifies the signals.

In other words, the differential amplifier 43 obtains the difference between the output signal So1 of the detector 11 and the output signal So2 of the detector 12 and averages the signals. Obviously, the inverter 44 may be provided at the subsequent stage of the detector 12, invert the output signal So2 of the detector 12, and supply the resultant signal to the differential amplifier 43.

Figure 11:
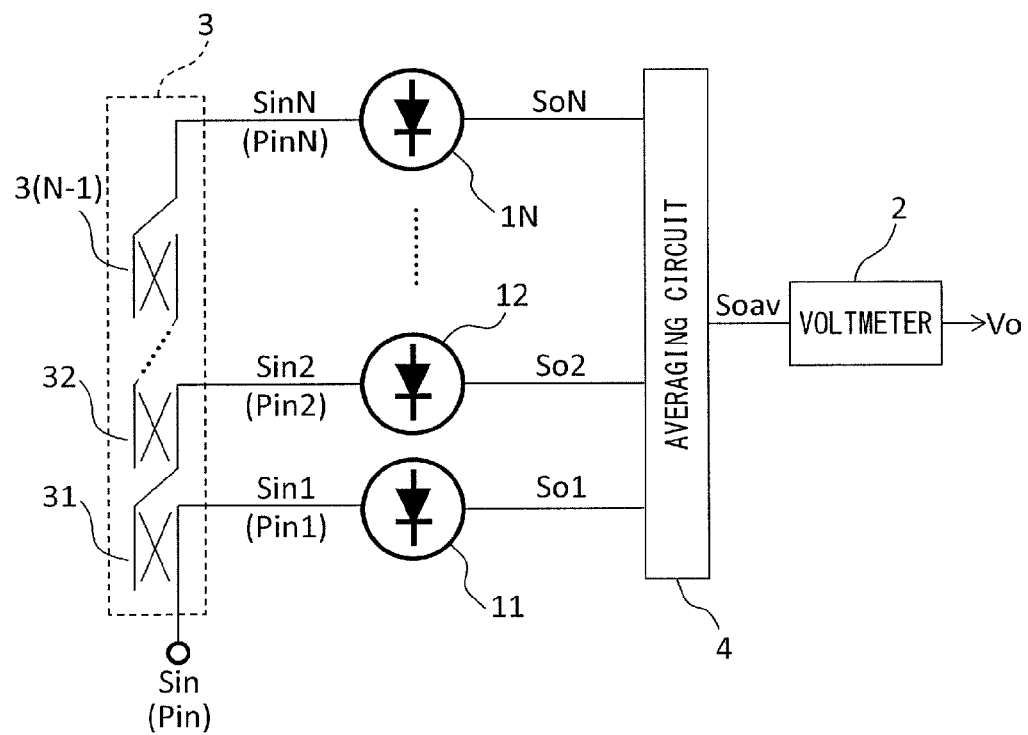
FIG. 11 is a block diagram illustrating a receiving device of a third embodiment.

FIG. 11 is a block diagram illustrating a receiving device of a third embodiment. The number of the above-described two detectors 11 and 12 is increased to N (N is an integer of two or larger).

As illustrated in FIG. 11, the receiving device of the third embodiment includes a dividing circuit 3, N pieces of detectors 11 to 1N, the averaging circuit 4, and the voltmeter (or AD converter, digital circuit, or the like). The N pieces of detectors 11 to 1N have equivalent circuit configurations and have the same dynamic range of, for example, 10 dB.

The dividing circuit 3 includes N−1 pieces of dividers (power dividers, couplers) 31 to 3(N−1), and each of the couplers 31 to 3(N−1) has a dividing ratio equivalent to the dynamic range of each of the detectors 11 to 1N.

Therefore, for example, the power Pin1 which is 90% of the input power Pin is supplied to the detector 11, and the residual power Pin2 which is 10% of the input power Pin is supplied to the detector 12. To the detector 1N, power PinN which is $(1/10)^{N-1}$ of the input power Pin is supplied.

In such a manner, the detectors 11 to 1N receive corresponding divided signals Sin1 to SinN divided by the dividing circuit 3 (couplers 31 to 3(N−1)) and perform the detecting process. The output signals So1 to SoN of the detectors 11 to 1N are supplied to the averaging circuit 4 and subjected to the averaging process, and the resultant signal is supplied as the output signal Soav to the voltmeter 2.

As the averaging circuit 4, a circuit obtained by modifying the circuit in FIG. 8 may be applied. Specifically, the switch 41 switches among the output signals So1 to SoN of the N pieces of detectors 11 to 1N at a predetermined timing, and the low-pass filter 42 receives a signal selected by the switch 41 and performs a process of filtering high-frequency components and passing low-frequency components.

The predetermined timing of switching the switch 41 is, for example, longer than one cycle (tin) of a carrier signal of the input signal Sin and shorter than 1/N of one cycle (To) of the output signals So1 to SoN of the detectors 11 to 1N.

In the switching operation of the switch 41, the switch 41 may not be switched according to the magnitude of the power of the input signal like the detectors 11, 12, . . . , and 1N. In other words, it is sufficient to select output signals of all of the detectors 11 to 1N in one cycle (To) of the output signals So1 to SoN of the detectors 11 to 1N, and the order is not limited.

The averaging circuit 4 including the differential amplifier 43 and the inverter 44 described with reference to FIG. 10 is suitable to average output signals of the two detectors 11 and 12. In the case of using the N pieces of detectors 11 to 1N (N is an integer of three or larger), the averaging circuit 4 in FIG. 8 is preferable.

Figure 12:
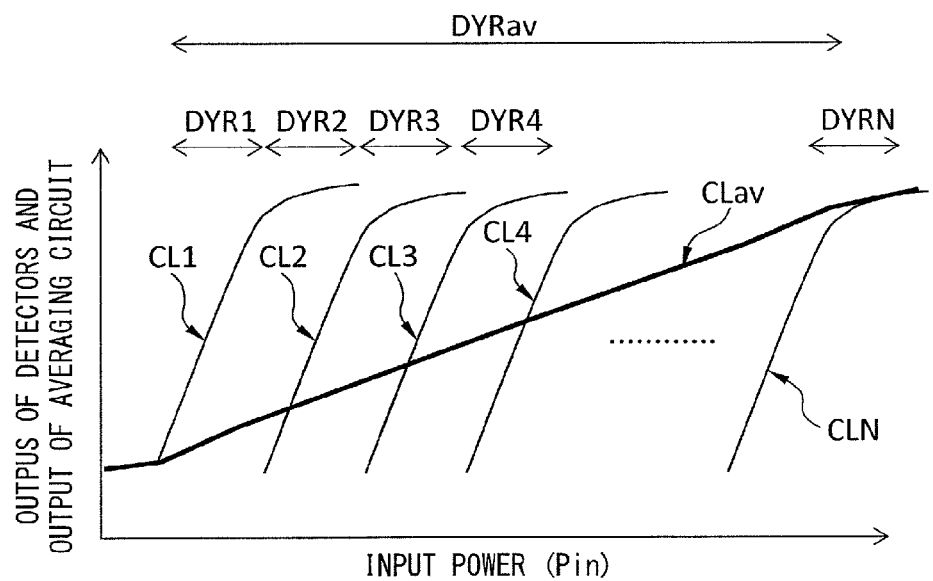
FIG. 12 is a diagram for explaining the operation of the receiving device of the third embodiment illustrated in FIG. 11.

FIG. 12 is a diagram for explaining the operation of the receiving device of the third embodiment illustrated in FIG. 11. As is clear from comparison between FIG. 12 and FIG. 8B described above, the dynamic range may be further enlarged by using N pieces (for example, N is an integer of three or larger) of detectors.

Obviously, due to various factors such as noise included in the input signal Sin, the characteristics of the coupler, or the characteristics of the detectors and the averaging circuit, the number of detectors which may be applied is limited.

Figure 13:
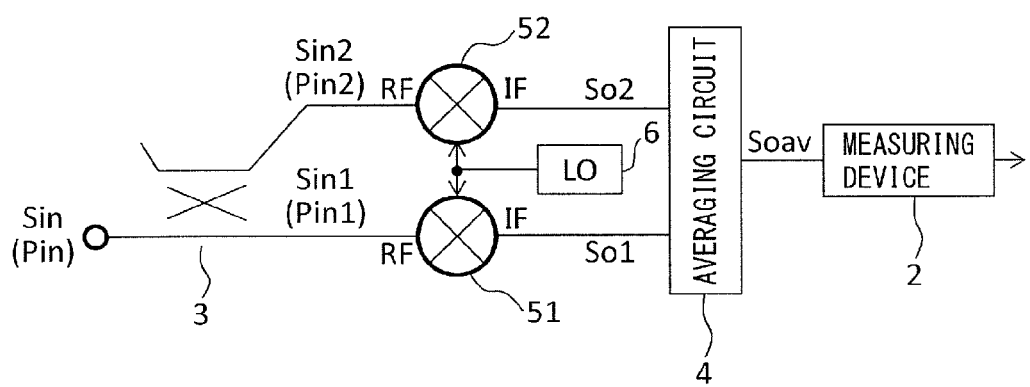
FIG. 13 is a block diagram illustrating a receiving device of a fourth embodiment.

FIG. 13 is a block diagram illustrating a receiving device of a fourth embodiment. In the foregoing embodiments, detectors are used as the internal circuits. In the receiving device of the fourth embodiment, mixers (frequency mixers) are applied as the internal circuit. In FIG. 13, reference numerals 51 and 52 denote mixers and 6 denotes a local oscillator (LO).

As illustrated in FIG. 13, for example, the input signal Sin of high frequency (RF) having the input power Pin is divided by the coupler 3 into two divided signals Sin1 and Sin2 having powers different from each other in accordance with a predetermined dividing ratio of the coupler 3, and the two divided signals are supplied to respective mixers 51 and 52.

The mixer 51 mixes the input RF signal Sin1 and a local signal from the local oscillator 6 and outputs a signal So1 of intermediate frequency (IF). Similarly, the mixer 52 mixes the input RF signal Sin2 and a local signal from the local oscillator 6 and outputs a signal So2 of intermediate frequency.

The output signals So1 and So2 of the mixers 51 and 52 are averaged by the averaging circuit 4 and an averaged output signal Soav is output. Although the mixers 51 and 52 also have the dynamic range for the input signal Sin (input power Pin), for example like in the detectors 11 and 12 in the foregoing embodiments, the dynamic range may be enlarged by applying the fourth embodiment.

Figure 14A:
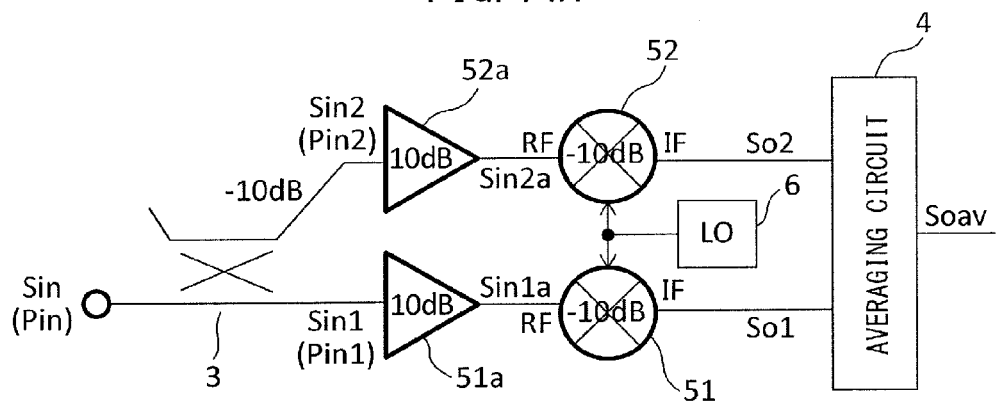
FIGS. 14A and 14B are diagrams for explaining the operation of a receiving device of a fifth embodiment.
Figure 14B:
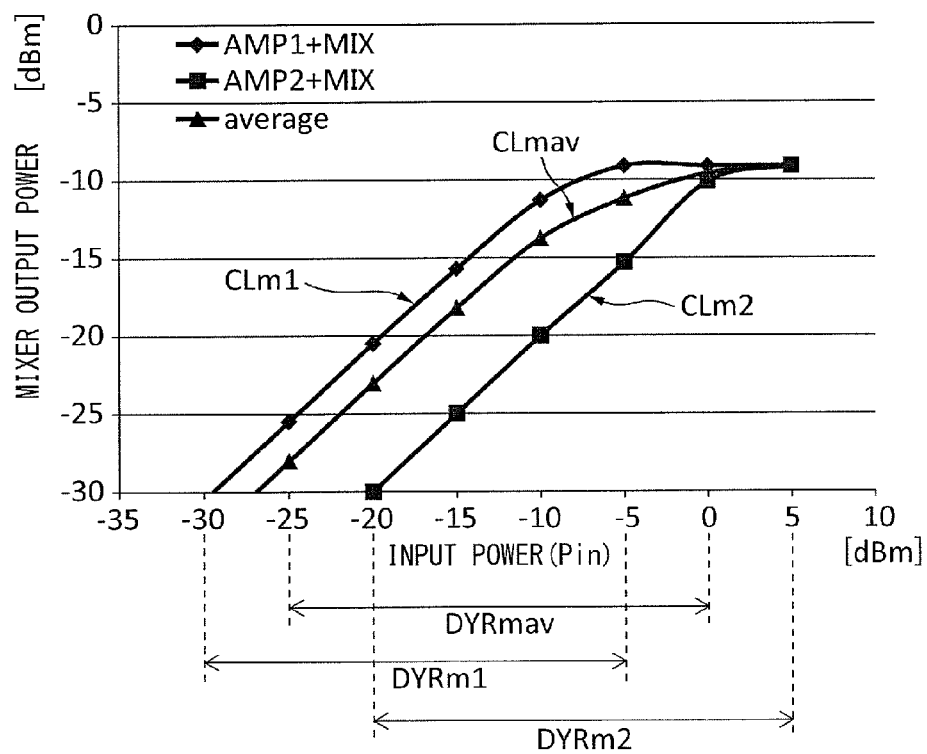

FIGS. 14A and 14B are diagrams for explaining the operation of a receiving device of a fifth embodiment. The receiving device of the fifth embodiment corresponds to a receiving device obtained by providing amplifiers 51a and 52a whose gains are equal at the preceding stage of the mixers 51 and 52 in the receiving device of the fourth embodiment illustrated in FIG. 13.

FIG. 14A is a block diagram of the receiving device of the fifth embodiment, and FIG. 14B is a diagram for explaining the dynamic range of the input power Pin in the receiving device of the fifth embodiment illustrated in FIG. 14A. The mixers 51 and 52 have equivalent circuit configurations and have the same conversion loss of, for example, 10 dB (−10 dB).

As illustrated in FIGS. 14A and 14B, the amplifiers 51a and 52a each having the gain of 10 dB are provided at the preceding stage of the mixers 51 an 52, respectively. The dividing ratio of the coupler 3 is 10 dB, and the ratio between the power Pin1 of the divided signal Sin1 and the power Pin2 of the divided signal Sin2 is 10:1.

In other words, power (Pin1) of 90% of the input power Pin is led to the amplifier 51a, and power (Pin2) of 10% of the input power Pin is led to the amplifier 52a. The gain of each of the amplifiers 51a and 52a is 10 dB (ten times) and the conversion loss of each of the mixers 51 and 52 is 10 dB, so that the relations between the input power Pin and the mixer outputs are as illustrated in FIG. 14B.

Concretely, as illustrated by a curve CLm1 in FIG. 14B, in a dynamic range DYRm1 of the mixer 51, for example, the mixer output power according to the input power is output in a region that the input power Pin is from −30 dBm to −5 dBm. In other words, the dynamic range DYRm1 of the mixer 51 is 25 dB.

As illustrated by a curve CLm2 in FIG. 14B, the mixer 52 to which 10% of the input power Pin is supplied by the coupler 3 via the amplifier 52a outputs a mixer output power according to the input power in a region that the input power Pin is from −20 dBm to 5 dBm. In other words, the dynamic range DYRm2 of the mixer 52 is also 25 dB.

As illustrated by a curve CLmav in FIG. 14B, the dynamic range DYRmav by the output Soav obtained by averaging the output signals So1 and So2 of the mixers 51 and 52 by the averaging circuit 4 is, for example, a region that the input power Pin is from −27 dBm to 5 dBm. In other words, by the receiving device of the fifth embodiment, the dynamic range DYRmav of the input power Pin, which may be used, may be enlarged to 32 dB.

Figure 15:
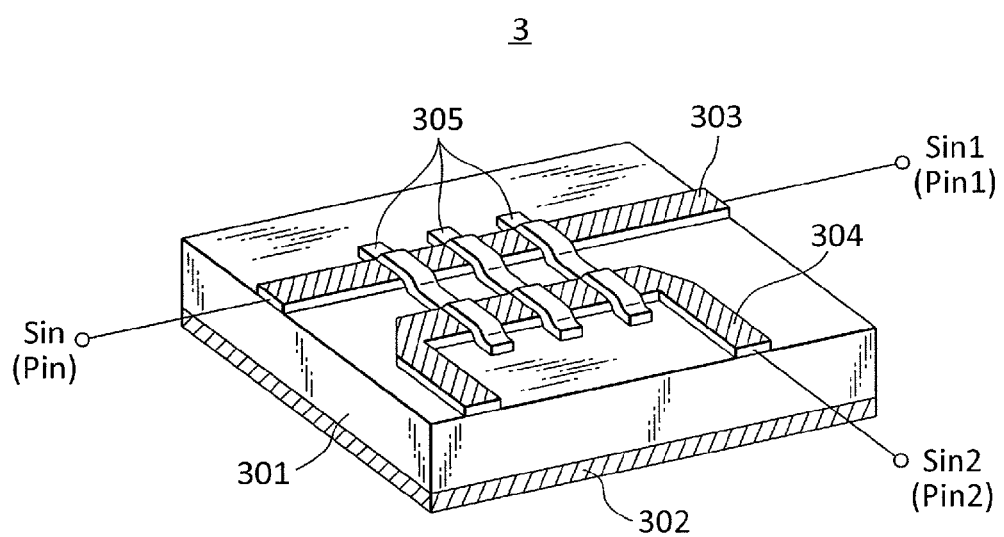
FIG. 15 is a diagram schematically illustrating an example of a divider.

FIG. 15 is a diagram schematically illustrating an example of a divider and illustrates an example of a microstrip line coupler. In FIG. 15, reference numeral 301 denotes a dielectric substrate, 302 denotes an earth conductor, 303 and 304 denote strip conductors, and 305 denotes a solder resist.

As illustrated in FIG. 15, on the surface of the dielectric substrate 301, the strip conductors 303 and 304 are formed so as to be partially parallel to each other. On the entire back side of the dielectric substrate 301, the earth conductor 302 is formed.

For example, in places of the parallel-disposed parts of the strip conductors 303 and 304 formed on the surface of the dielectric substrate 301, the solder resists 305 made of dielectric are formed so as to obtain a predetermined dividing ratio.

To the coupler 3, for example, the input signal Sin is supplied from the left side of the strip conductor 303, the divided signal Sin1 is taken out from the right side of the strip conductor 303 and, further, the divided signal Sin2 is taken out from the right side of the strip conductor 304.

The microstrip line coupler illustrated in FIG. 15 is preferable, for example, when the application frequency (carrier frequency of the input signal Sin) is in GHz band or higher. Obviously, the microstrip line coupler illustrated in FIG. 15 is just an example, and various microstrip line couplers may be applied.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A receiving device comprising:
   a dividing circuit configured to divide an input signal into N pieces of divided signals (where N is an integer of two or larger);
   N pieces of detectors configured to receive and process the N pieces of divided signals; and
   an averaging circuit configured to receive N pieces of output signals from the N pieces of detectors, averaging the output signals, and output an averaged signal, wherein
   the dividing circuit includes N−1 pieces of dividers, and divides the input signal into the N pieces of divided signals so that the divided signals have powers different from each other, and
   each of the dividers divides a dividing-target signal which is supplied into two divided signals having powers different from each other in accordance with a predetermined dividing ratio so as to enlarge a dynamic range of each of the detectors.

2. The receiving device according to claim 1, wherein when N is an integer of three or larger, the divider in the (N−1)th stage receives, as the dividing-target signal, one of two divided signals divided from the divider in the (N−2)th stage.

3. The receiving device according to claim 1, wherein the N pieces of detectors are equivalent circuits each other, and
   the predetermined dividing ratio is equal to a dynamic range of each of the detectors.

4. The receiving device according to claim 1, wherein each of the dividers is a microstrip line divider.

5. The receiving device according to claim 1, wherein the averaging circuit comprises:
   a switch switching among the N pieces of output signals; and
   a low-pass filter receiving a signal selected by the switch, filtering high-frequency components, and passing low-frequency components.

6. The receiving device according to claim 5, wherein the switch is switched at a timing shorter than 1/N of one cycle in the N pieces of output signal and longer than one cycle of a carrier signal of the input signal.

7. The receiving device according to claim 6, wherein the low-pass filter cuts off frequency of a switching clock used for switch-control on the switch.

8. The receiving device according to claim 1, wherein the N pieces of detectors are two detectors which are first and second detectors.

9. The receiving device according to claim 8, wherein the averaging circuit includes a differential amplifier and an inverter, and
   the differential amplifier receives, through differential input terminals, a signal obtained by inverting a first output signal which is output from the first internal circuit by the inverter and a second output signal which is output from the second internal circuit.

10. The receiving device according to claim 1, the receiving device further comprising N pieces of amplifiers provided at the preceding stages of the N pieces of detectors.

11. The receiving device according to claim 1, wherein each of the internal circuits is a mixer.

12. The receiving device according to claim 1, wherein the input signal is a signal of 10 GHz or higher.

* * * * *